(12) United States Patent
Michael et al.

(10) Patent No.: US 6,188,233 B1
(45) Date of Patent: Feb. 13, 2001

(54) METHOD FOR DETERMINING PROXIMITY EFFECTS ON ELECTRICAL CHARACTERISTICS OF SEMICONDUCTOR DEVICES

(75) Inventors: Mark W. Michael, Cedar Park; John L. Nistler, Martindale, both of TX (US)

(73) Assignee: Advanced Micro Devices, Inc., Austin, TX (US)

( * ) Notice: Under 35 U.S.C. 154(b), the term of this patent shall be extended for 0 days.

(21) Appl. No.: 09/161,143

(22) Filed: Sep. 25, 1998

(51) Int. Cl.[7] .................................................. G01R 31/26
(52) U.S. Cl. .............................. 324/765; 324/769; 438/14
(58) Field of Search .................................... 324/755, 756, 324/760, 765, 537, 523, 769; 395/500.05, 500.06; 438/14, 17

(56) References Cited

U.S. PATENT DOCUMENTS

| | | | |
|---|---|---|---|
| 5,477,160 | * 12/1995 | Love | 324/755 |
| 5,489,851 | * 2/1996 | Heumann et al. | 324/537 |
| 5,754,410 | * 5/1998 | Bardsley et al. | 361/777 |
| 6,026,221 | * 2/2000 | Ellison et al. | 395/500.05 |

* cited by examiner

Primary Examiner—Safet Metjahic
Assistant Examiner—Minh Tang
(74) Attorney, Agent, or Firm—Williams, Morgan & Amerson, P.C.

(57) ABSTRACT

The present invention is directed to a method for determining changes in electrical characteristics of semiconductor devices due to the fabrication of the devices in proximity to other devices or structures. The method comprises fabricating a plurality of semiconductor devices configured in a series arrangement and biasing all but one of the semiconductor devices to an active state. Thereafter, the remaining semiconductor device is biased to an active state and the electrical characteristics of the last semiconductor device is monitored.

25 Claims, 1 Drawing Sheet

METHOD FOR DETERMINING PROXIMITY EFFECTS ON ELECTRICAL CHARACTERISTICS OF SEMICONDUCTOR DEVICES

BACKGROUND OF THE INVENTION

1. Field of the Invention

The present invention is generally directed to the testing of semiconductor devices, and, more particularly, to the testing of electrical characteristics of semiconductor devices.

2. Description of the Related Art

As the feature size of semiconductor devices continues to decrease, the effects of manufacturing a semiconductor device in proximity to other semiconductor devices, or other structures, e.g., metallic interconnect lines, becomes more pronounced. It is known that the actual feature size of a fabricated semiconductor device, for example, the gate width of a field effect transistor, may be different than the designed feature size of the device, i.e., a feature size of a semiconductor device as actually built may be different from the designed size of that feature. One factor that causes differences between the design feature size and the actual feature size is the proximity of the device under construction to other structures or other semiconductor devices. That is, features that are all designed to be the same size may measure one dimension when the semiconductor device is made in an isolated area, and may measure a different dimension when the same semiconductor device is fabricated in proximity to adjacent structures, e.g., other devices, interconnect lines, etc.

In integrated circuits, there are areas where the semiconductor devices, e.g., transistors, are densely packed, areas where the devices are isolated, and areas that fall somewhere between these two extremes. In general, densely packed regions of an integrated circuit are areas where the semiconductor devices are placed as close together as possible. Isolated devices are areas where there is little, if any, surrounding structure adjacent the semiconductor devices. There are also circuits in which the devices, e.g., transistors, are placed as close together as possible, yet still allow room for metal lines and contacts between the transistors, i.e., an intermediate density.

The change in the actual feature size of a semiconductor device, as compared to the designed feature size, can have many negative impacts on the electrical characteristics of the device. For example, in the case of field effect transistors, the variance in, for example, the channel length of the transistor due to manufacturing the transistor in proximity to other devices or structures can impact, among other things, the drive current consumed by the device during operations. Drive current tends to vary with the channel length of the device. In general, as the channel length decreases, the drive current and the leakage through the gate increases. The reduction in the channel length may also cause the circuit to use more power and potentially exceed the power supply specification for the particular circuit, i.e., it will consume more power than anticipated. That is, changes in feature sizes of semiconductor devices, e.g., changes in the channel length of transistors due to proximity effects, must be accounted for in designing integrated circuits.

Thus, it is desirable to develop a method for determining the impact on electrical characteristics of a semiconductor device due to changes in feature sizes as a result of fabricating the device in proximity to other structures. Such information may be useful in the design and manufacturing of integrated circuit devices. The present invention is directed to solving some or all of the aforementioned problems.

SUMMARY OF THE INVENTION

The present invention is directed to a method for determining the electrical characteristics of semiconductor devices due to the fabrication of the semiconductor devices in close proximity to other semiconductor devices or structures. The method comprises fabricating a plurality of semiconductor devices in a substrate, the plurality of devices being configured in an electrical series. The method further comprises biasing all but one of said semiconductor devices to an active state and, thereafter, biasing said one of said devices to an active state. The method also includes monitoring the electrical characteristics of said one of said semiconductor devices.

BRIEF DESCRIPTION OF THE DRAWINGS

The invention may be understood by reference to the following description taken in conjunction with the accompanying drawings, in which like reference numerals identify like elements, and in which.

Figure 1:
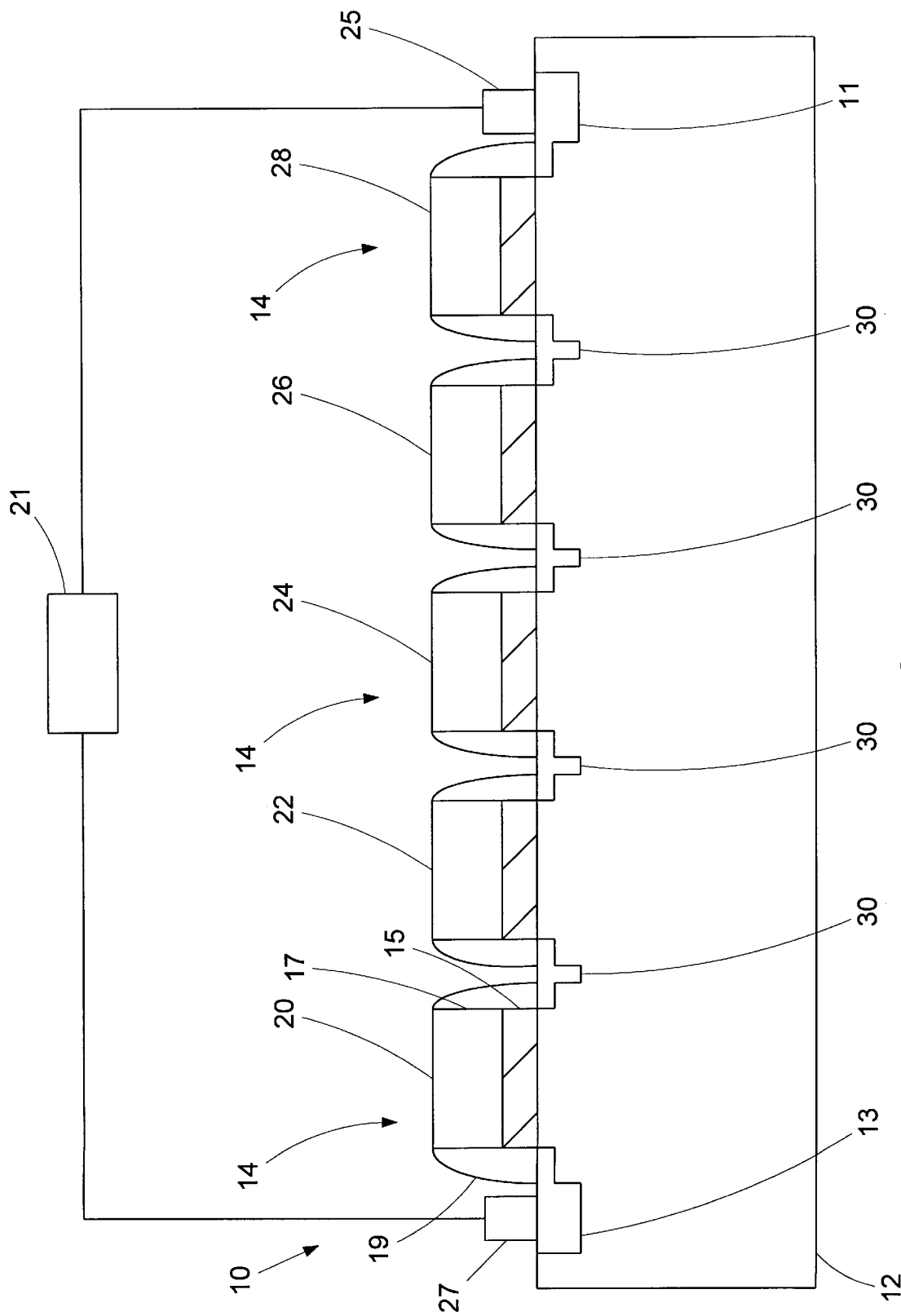
FIG. 1 is a cross-sectional, schematic view of one illustrative embodiment of a device for use with the inventive method disclosed herein.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

As shown in FIG. 1, a testing device 10 is comprised of a semiconducting substrate 12 with a plurality of semiconductor devices 14 formed thereon. In one illustrative embodiment, the semiconductor devices are transistors 20, 22, 24, 26 and 28. Each of the transistors 20, 22, 24, 26 and 28 is comprised of a gate dielectric 15, a gate conductor 17 and a plurality of sidewall spacers 19. A shared source/drain region 30 is formed between the transistors 20–22, 22–24, 24–26, and 26–28 as shown in FIG. 1. A separate source region 11 is formed adjacent the transistor 28, and a separate drain region 13 is formed adjacent the transistor 20. In one embodiment, the source and drain regions 11, 13 may have a traditional lightly doped structure, as depicted in FIG. 1. Although five semiconductor devices 14 are depicted in FIG. 1, upon a complete reading of the present application, those skilled in the art will appreciate that the present method is not limited to testing an arrangement of five semiconductor devices, i.e., the number of semiconductor devices 14 may be more or less than five.

In one embodiment, the transistors 20, 22, 24, 26 and 28 are NMOS transistors. Those skilled in the art will recognize upon a complete reading of the present disclosure that the method disclosed herein is not limited to NMOS technology. Rather, the principles of the present invention may be applied to PMOS and CMOS technology, and may be used to test proximity effects on memory devices, logic devices, etc. In one embodiment, the substrate 12 is silicon (with or without an epitaxial layer of silicon), the gate dielectric 15 is comprised of silicon dioxide, the gate conductor 17 is comprised of polysilicon, and the source/drain regions 11, 13, 30 are implanted with an $N^+$ dopant material, such as arsenic (Ar). However, the present inventive method is not limited to any particular structure of the semiconductor device 14. That is, the semiconductor device 14 may have a different physical structure and may be made from completely different materials of construction.

The transistors 20, 22, 24, 26 and 28 may be made using traditional techniques for forming such devices. For example, a layer of silicon dioxide (not shown) may be formed above the substrate 12, for example, by thermal growing. Thereafter, a layer of polysilicon (not shown) may be formed above the layer of silicon dioxide by, for example, a chemical vapor deposition process. A layer of photoresist may then be formed above the layer of polysilicon and patterned to expose portions of the polysilicon layer. Portions of the polysilicon layer and silicon dioxide layer may then be removed by, for example, one or more etching steps to define the gate dielectric layer 15 and the gate conductor 17 of each of the transistors 20, 22, 24, 26 and 28.

Thereafter, an initial light doping of the source/drain regions 11, 13, 30 may be performed by a low-energy ion implantation step. Next, the sidewall spacers 19, which may be comprised of silicon dioxide or silicon nitride, may be formed by depositing a layer of, for example, silicon dioxide, above the surface of the substrate 12 and performing an anisotropic etch of the silicon dioxide to result in the spacers 19 shown in FIG. 1. Note that the sidewall spacers 19 formed between the transistors 20–22, 22–24, 24–26, and 26–28 occupy virtually the entire space between the gate conductors 17 of the adjacent transistors. Then, the source/drain regions 11, 13, 30 may be subjected to a second, higher energy ion implantation step to form the lightly doped structure depicted in FIG. 1.

Metal interconnect lines 25, 27 may then be formed to electrically couple the source region 11 of transistor 28 and the drain region 13 of transistor 20 to an electrical testing apparatus depicted schematically as item 21. The electrical testing device may also be coupled to the gate conductors 17 of the transistors 20, 22, 24, 26 and 28 to monitor the electrical characteristics of those devices, e.g., drive current, etc. In one embodiment, the electrical testing equipment may be computer controlled electronic testing equipment, such as an HP 4062 computer, manufactured by Hewlett Packard Corp. Of course, as is readily apparent to those skilled in the art, the metal interconnect lines 25, 27 may be comprised of a variety of materials, e.g., aluminum, copper, etc., and may be formed using well-known techniques, e.g., vacuum evaporation, sputtering, chemical vapor deposition, etc.

Those skilled in the art will recognize that the testing device 10 depicted in FIG. 1 has a plurality of transistors 20, 22, 24, 26 and 28 that are arranged in electrical series. In such a configuration, current flow from the source 11 to the drain 13 will only occur if all five transistors 20, 22, 24, 26 and 28 are active, or biased "ON." With respect to the illustrative NMOS technology discussed herein, this occurs when a sufficient positive voltage (a logically "HIGH" voltage) is applied to the gate conductor 17 of each of the transistors 20, 22, 24, 26 and 28. Of course, those skilled in the art recognize that the testing device 10 could be made using PMOS technology, in which case the current would only flow from the source 11 to the drain 13 if a sufficiently low voltage (a logically "LOW" voltage) is applied to the gate conductor 17 of all of the transistors 20, 22, 24, 26 and 28.

As shown in FIG. 1, the transistors 20, 22, 24, 26 and 28 may be formed as close to one another as possible. Of course, the spacing between the illustrative transistors varies as feature sizes on semiconductor devices continue to decrease. Using current technology, the spacing between the gate conductor 17 of adjacent transistors, e.g., 22 and 24, is on the order of approximately 0.25 µm.

The transistor 22 represents a fully dense semiconductor device. The transistor 24 is formed between the transistors 20, 22 and 26, 28. The transistors 20 and 28 are more like completely isolated semiconductor devices in that they are formed adjacent to only a single transistor, i.e., 22, 26, respectively. The transistors 22 and 26 have an intermediate density in that they are formed between a densely packed transistor, e.g., 24, and an isolated transistor, e.g., 28. Thus, the actual electrical characteristics of the transistor 26 may also vary from the design characteristics due to proximity effects in manufacturing.

The present inventive method is directed to a method of testing changes in electrical characteristics of a semiconductor device due to it being manufactured in proximity to different structure(s). In one illustrative embodiment where the devices 14 are transistors, the characteristics may include, but are not limited to, drive current, off-state current, threshold voltage, transconductance, body factor, etc. Due to the small spacing between the transistor 24 and the adjacent transistors 22, 26, it is not possible to directly couple electrical test instrumentation to the shared source/drain regions 30 on each side of transistor the 24 to test its electrical characteristics when the transistor 24 is biased "ON," or transitioning between "ON" and "OFF" states.

The electrical characteristics of the densely packed transistor 24 may be determined as follows. A sufficient voltage is applied to the gate conductors 17 of the transistors 20, 22, 26 and 28 to bias the transistors "ON," i.e., the gate conductors 17 of the transistors 20, 22, 26 and 28 are coupled to a logically "HIGH" voltage source. A logically "LOW" voltage is applied to the gate conductor 17 of the transistor 24. In this condition, since the transistors 20, 22, 24, 26 and 28 are arranged in an electrical series, no current will flow between the source 11 and drain 13. By applying a sufficient voltage to the gate conductor 17 of transistor 24 to bias it "ON," the electrical characteristics, e.g., drive current, etc., of the transistor 24 can be explored and, if desired, compared and contrasted with the same characteristics of a device of the same design that was fabricated in an isolated environment. The present technique allows for an extensive examination of the electrical characteristics of the semiconductor device under consideration, e.g., transistor 24. That is, the present method may be used to explore a variety of characteristics of the device when it is active ("ON"), non-active ("OFF") or transitioning between the two states in either direction.

This same technique can be applied to determine the electrical characteristics of the other transistors 20, 22, 26, and 28. For example, with the transistors 20, 22, 24 and 26 "ON," the electrical characteristics of the transistor 28 (which has a dense construction on one side and an isolated construction on the other) can be explored. Similarly, the electrical characteristics of the transistor 26, which has a fully dense construction on one side, e.g., transistors 22 and 24, and only one transistor, i.e., 28, on the other, can also be explored.

The information obtained from the present invention is useful in the design of integrated circuits. For example, if it is determined that transistors fabricated in a fully dense environment have a drive current and a leakage that exceeds what would otherwise be expected from a similar transistor fabricated in an isolated environment, then appropriate changes may be made to various design parameters for the integrated circuits. One example would be that, for densely packed transistors having higher than expected leakage, the power supply specification for the integrated circuit may have to be increased by an appropriate factor. Other uses of the information obtained using the present method will be readily apparent to those skilled in the art.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for exploring the electrical characteristics of semiconductor devices, comprising:

fabricating a plurality of semiconductor devices above a semiconducting substrate, each of said semiconductor devices having electrical characteristics, said plurality of semiconductor devices configured in an electrical series;

biasing all but one of said semiconductor devices to an active state and thereafter, biasing said one of said semiconductor devices to an active state; and monitoring the electrical characteristics of said one of said semiconductor devices.

2. The method of claim 1, wherein fabricating the plurality of semiconductor devices in the semiconducting substrate comprises fabricating a plurality of transistors in the semiconducting substrate.

3. The method of claim 1, wherein biasing all but one of said semiconductor devices to the active state and thereafter, biasing said one of said semiconductor devices to an active state comprises biasing all of said semiconductor devices to a logically high state.

4. The method of claim 1, wherein biasing all but one of said semiconductor devices to the active state and thereafter, biasing said one of said semiconductor devices to an active state comprises biasing all of said semiconductor devices to a logically low state.

5. The method of claim 1, wherein monitoring the electrical characteristics of said one of said semiconductor devices comprises monitoring a drive current of said one of said semiconductor devices.

6. The method of claim 1, wherein monitoring the electrical characteristics of said one of said semiconductor devices comprises biasing said one of said semiconductor devices to an "OFF" state, and monitoring an off-state current of said one of said semiconductor devices.

7. The method of claim 1, wherein monitoring the electrical characteristics of said one of said semiconductor devices comprises monitoring a threshold voltage of said one of said semiconductor devices.

8. The method of claim 1, wherein monitoring the electrical characteristics of said one of said semiconductor devices, comprises:

attaching a computer controlled electrical testing apparatus to at least two of said plurality of semiconductor devices; and observing the electrical characteristics of said one of said semiconductor devices as indicated by said electrical testing apparatus.

9. The method of claim 1, wherein fabricating a plurality of semiconductor devices above a substrate comprises fabricating at least three semiconductor devices above a semiconducting substrate.

10. A method for exploring the electrical characteristics of semiconductor devices, comprising:

fabricating a plurality of transistors above a semiconducting substrate, each of said transistors having electrical characteristics, said plurality of transistors configured in an electrical series;

biasing all but one of said transistors to an active state and thereafter, biasing said one of said transistors to an active state; and monitoring the electrical characteristics of said one of said transistors.

11. The method of claim 10, wherein biasing all but one of said transistors to the active state and thereafter, biasing said one of said transistors to an active state comprises biasing all of said transistors to a logically high state.

12. The method of claim 10, wherein biasing all but one of said transistors to the active state and thereafter, biasing said one of said transistors to an active state comprises biasing all of said transistors to a logically low state.

13. The method of claim 10, wherein monitoring the electrical characteristics of said one of said transistors comprises monitoring a drive current of said one of said transistors.

14. The method of claim 10, wherein monitoring the electrical characteristics of said one of said transistors comprises biasing said one of said transistors to an "OFF" state, and monitoring an off-state current of said one of said transistors.

15. The method of claim 10, wherein monitoring the electrical characteristics of said one of said transistors comprises monitoring a threshold voltage of said one of said transistors.

16. The method of claim 10, wherein monitoring the electrical characteristics of said one of said transistors, comprises:

attaching a computer controlled electrical testing apparatus to at least two of said plurality of transistors; and observing the electrical characteristics of said one of said transistors as indicated by said electrical testing apparatus.

17. The method of claim 10, wherein fabricating a plurality of transistors above a substrate comprises fabricating at least three transistors above a semiconducting substrate.

18. The method of claim 10, wherein fabricating a plurality of transistors above a substrate comprises fabricating at least five transistors above a semiconducting substrate.

19. The method of claim 16, wherein attaching a computer controlled electrical testing apparatus to at least two of said plurality of transistors comprises attaching a computer controlled testing apparatus to transistors on opposite ends of said electrical series.

20. A method for exploring the electrical characteristics of semiconductor devices, comprising:

fabricating a plurality of transistors above a semiconducting substrate, each of said transistors sharing at least one common source/drain region with an adjacent transistor and each of said transistors having electrical characteristics, said plurality of transistors configured in an electrical series, a first one of said transistors having a non-shared source region and a second one of said transistors having a non-shared drain region;

biasing all but one of said transistors to an active state and, thereafter, biasing said one of said transistors to an active state;

attaching a computer controlled electrical testing apparatus to said non-shared source region of said first transistor and to said non-shared drain region of said second transistor; and observing the electrical characteristics of said one of said transistors as indicated by said electrical testing apparatus.

21. The method of claim 20, wherein fabricating a plurality of transistors above the semiconducting substrate comprises fabricating at least five transistors above the semiconducting substrate.

22. The method of claim 20, wherein biasing all but one of said transistors to an active state and, thereafter, biasing said one of said transistors to an active state comprises biasing all of said transistors to a logically high state.

23. The method of claim 20, wherein biasing all but one of said transistors to an active state and, thereafter, biasing said one of said transistors to an active state comprises biasing all of said semiconductor devices to a logically low state.

24. The method of claim 20, wherein observing the electrical characteristics of said one of said transistors as indicated by said electrical testing apparatus comprises observing the electrical characteristics of said one of said transistors as indicated by said electrical testing apparatus, said electrical characteristics comprised of at least one of a drive current, an off-state current and a threshold voltage of said transistor.

25. The method of claim 20, wherein fabricating a plurality of transistors above a substrate comprises fabricating at least three transistors above a semiconducting substrate.

* * * * *